(12) United States Patent
Li et al.

(10) Patent No.: US 9,349,654 B2
(45) Date of Patent: May 24, 2016

(54) ISOLATION FOR EMBEDDED DEVICES

(71) Applicant: GLOBALFOUNDRIES Singapore Pte. Ltd., Singapore (SG)

(72) Inventors: Liang Li, Singapore (SG); Xuesong Rao, Singapore (SG); Martina Damayanti, Singapore (SG); Wei Lu, Singapore (SG); Alex See, Singapore (SG); Yoke Leng Lim, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 124 days.

(21) Appl. No.: 14/228,258

(22) Filed: Mar. 28, 2014

(65) Prior Publication Data
US 2015/0279743 A1    Oct. 1, 2015

(51) Int. Cl.
| | |
|---|---|
| H01L 21/8234 | (2006.01) |
| H01L 21/311 | (2006.01) |
| H01L 21/28 | (2006.01) |
| H01L 29/06 | (2006.01) |
| H01L 21/762 | (2006.01) |
| H01L 27/115 | (2006.01) |

(52) U.S. Cl.
CPC .. *H01L 21/823481* (2013.01); *H01L 21/28229* (2013.01); *H01L 21/28273* (2013.01); *H01L 21/31111* (2013.01); *H01L 21/31144* (2013.01); *H01L 21/762* (2013.01); *H01L 27/11526* (2013.01); *H01L 27/11546* (2013.01); *H01L 29/0649* (2013.01)

(58) Field of Classification Search
CPC ............ H01L 21/762; H01L 21/76224; H01L 21/76232; H01L 21/76235; H01L 27/11526; H01L 27/115448
USPC .......................... 438/275, 218, 221, 294, 296
See application file for complete search history.

(56) References Cited

U.S. PATENT DOCUMENTS

| | | | | |
|---|---|---|---|---|
| 6,319,780 | B2 * | 11/2001 | Crivelli ................. | 257/E21.645 |
| 6,475,862 | B1 * | 11/2002 | Ando ................. | H01L 21/28202 257/E21.268 |
| 2007/0122981 | A1 * | 5/2007 | Park ................ | H01L 21/823462 438/275 |

* cited by examiner

*Primary Examiner* — Kevin M Picardat
(74) *Attorney, Agent, or Firm* — Horizon IP Pte. Ltd.

(57) ABSTRACT

Device and a method of forming a device are presented. The method includes providing a substrate prepared with isolation regions. The substrate includes first, second and third regions. The first region includes a memory region, the second region includes a high voltage (HV) region and the third region includes a logic region. An additional dielectric layer covering the substrate and the isolation regions is formed. A first select region is selectively processed while protecting first non-select regions. The first select region is one of the first, second and third device regions. A first gate dielectric is formed on the select region. Top substrate active area and isolation regions of the first non-select regions are not exposed during processing of the first select region and forming the first gate dielectric.

21 Claims, 16 Drawing Sheets

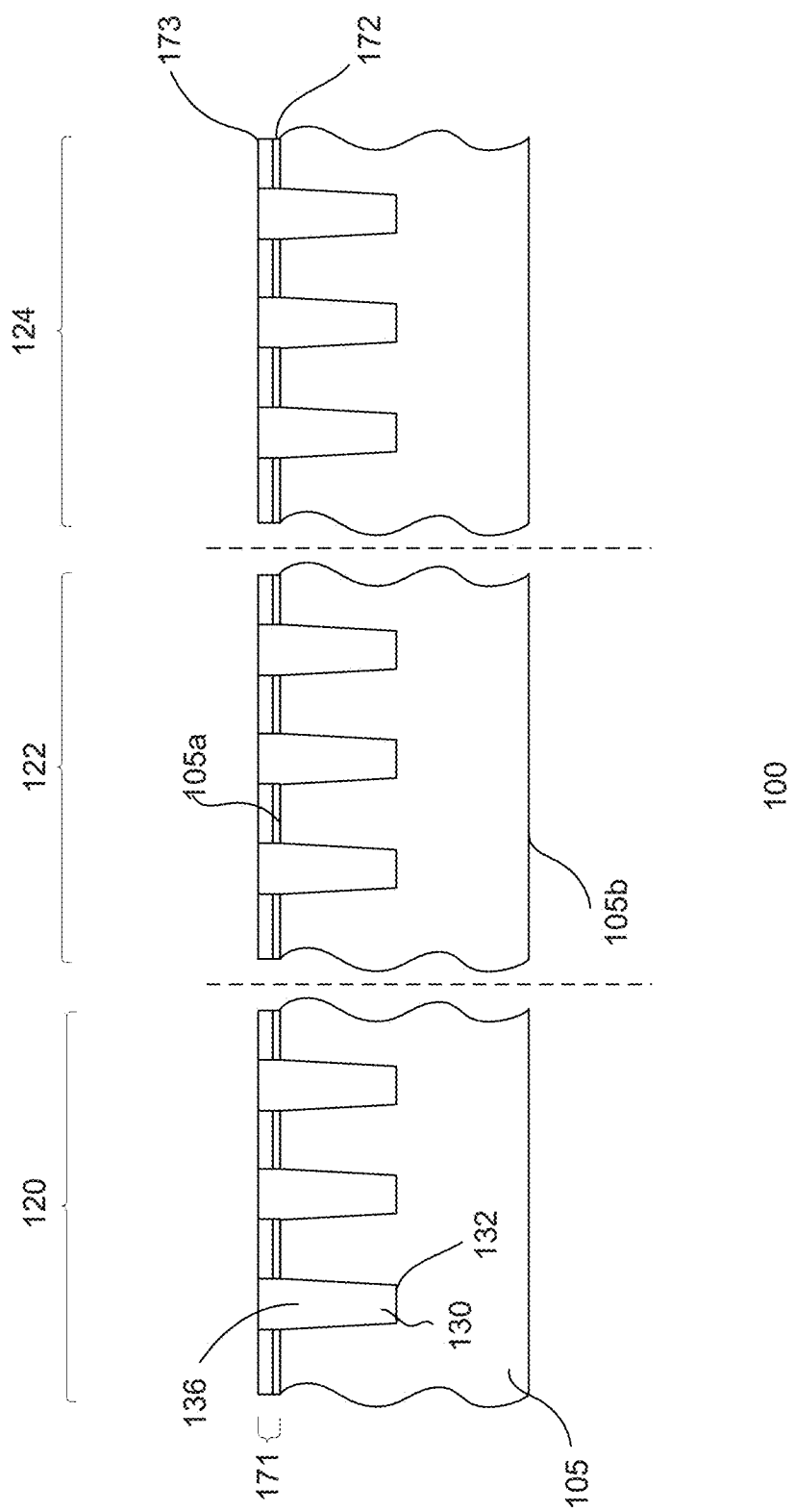

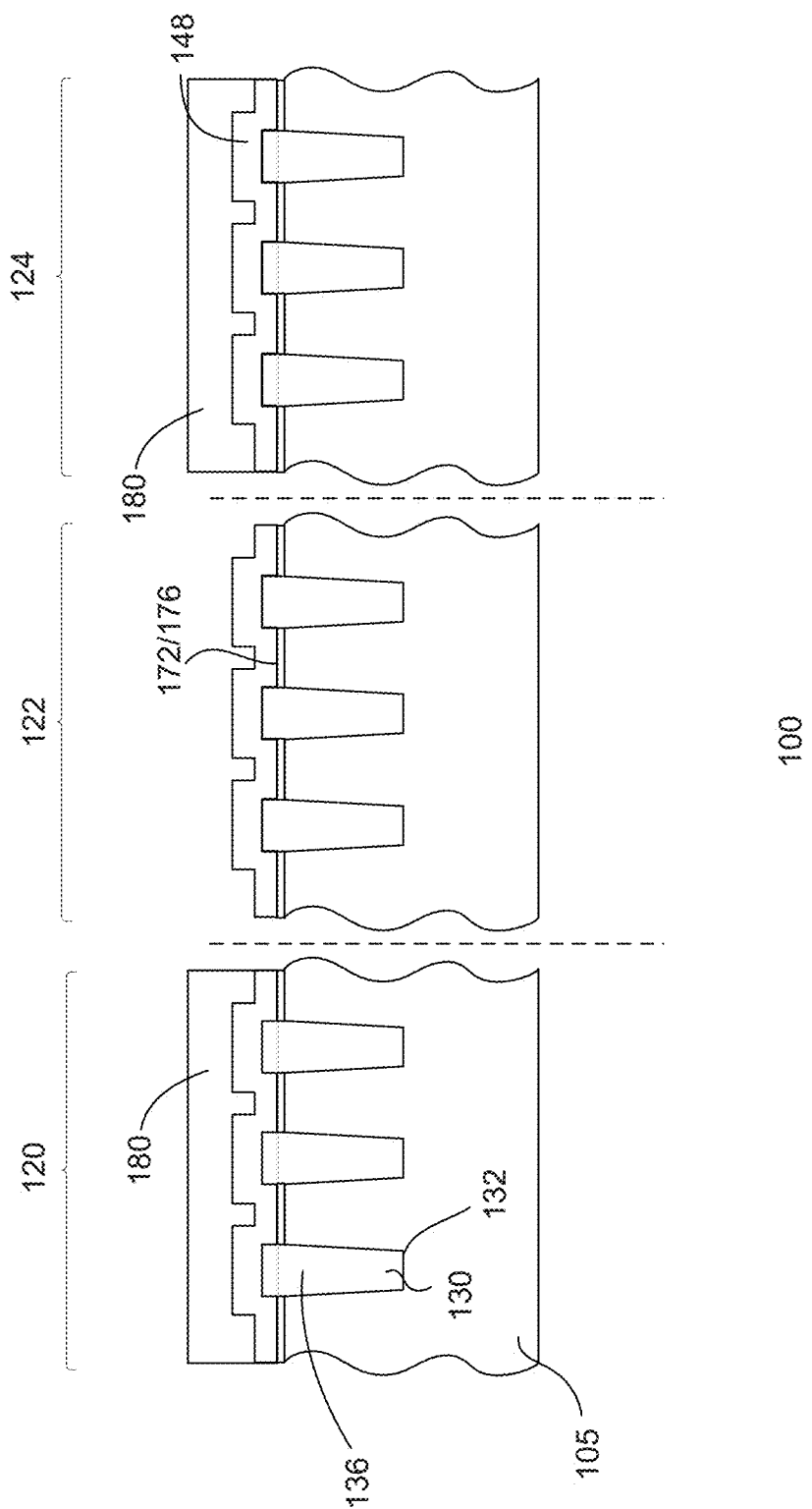

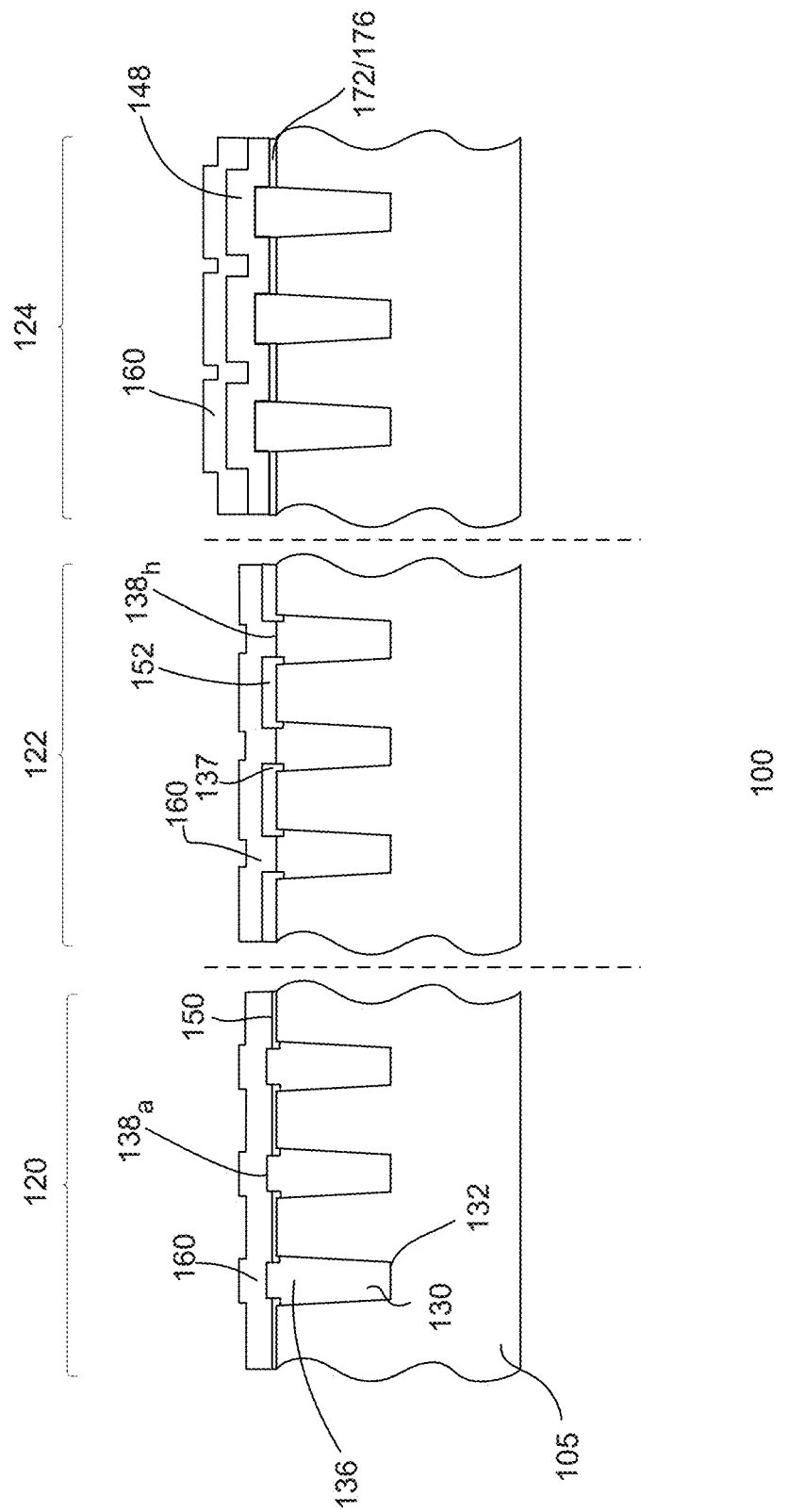

US 9,349,654 B2

ISOLATION FOR EMBEDDED DEVICES

BACKGROUND

As technology evolves into era of sub-micron, there is a desire to integrate different types of devices, such as memory, high voltage (HV) devices and high speed logic circuit elements, into a single chip or integrated circuit (IC) to form an embedded device. Nevertheless, it is difficult to integrate these different types of devices in a single chip since each of these devices has different requirements. For example, some conventional manufacturing processes suitable for use for one type of device may compromise the quality or may not be suitable for the other types of devices. Thus, reliabilities of the one or more type of devices may degrade during integration of these various types of devices into a single chip.

From the foregoing discussion, it is desirable to provide a reliable, high performing and simplified solution for integrating different types of devices in the same IC.

SUMMARY

Embodiments generally relate to a device and a method for forming a device. In one embodiment, a method for forming a device is presented. The method includes providing a substrate prepared with isolation regions. The substrate includes first, second and third regions. The first region includes a memory region, the second region includes a high voltage (HV) region and the third region includes a logic region. An additional dielectric layer covering the substrate and the isolation regions is formed. A first select region is selectively processed while protecting first non-select regions. The first select region is one of the first, second and third device regions. A first gate dielectric is formed on the select region. Top substrate active area and isolation regions of the first non-select regions are not exposed during processing of the first select region and forming the first gate dielectric.

In another embodiment, a device is disclosed. The device includes a substrate prepared with isolation regions. The substrate includes first, second and third regions. The first region includes a memory region, the second region includes a high voltage (HV) region and the third region includes a logic region. Additional dielectric layer is disposed over isolation regions of at least one selected regions. The at least one of the selected regions is one of the first, second and third device regions and wherein the additional dielectric layer elevates height of the isolation regions of the selected region. First gate dielectric is disposed on the select region. The STI regions in the selected region include a top surface above a top surface of the first gate dielectric which forms a tunable step height.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Embodiments generally relate to semiconductor devices. More particularly, some embodiments relate to devices such as, but are not limited to, non-volatile memory (NVM) devices, high voltage (HV) devices and logic devices. Such devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1B:
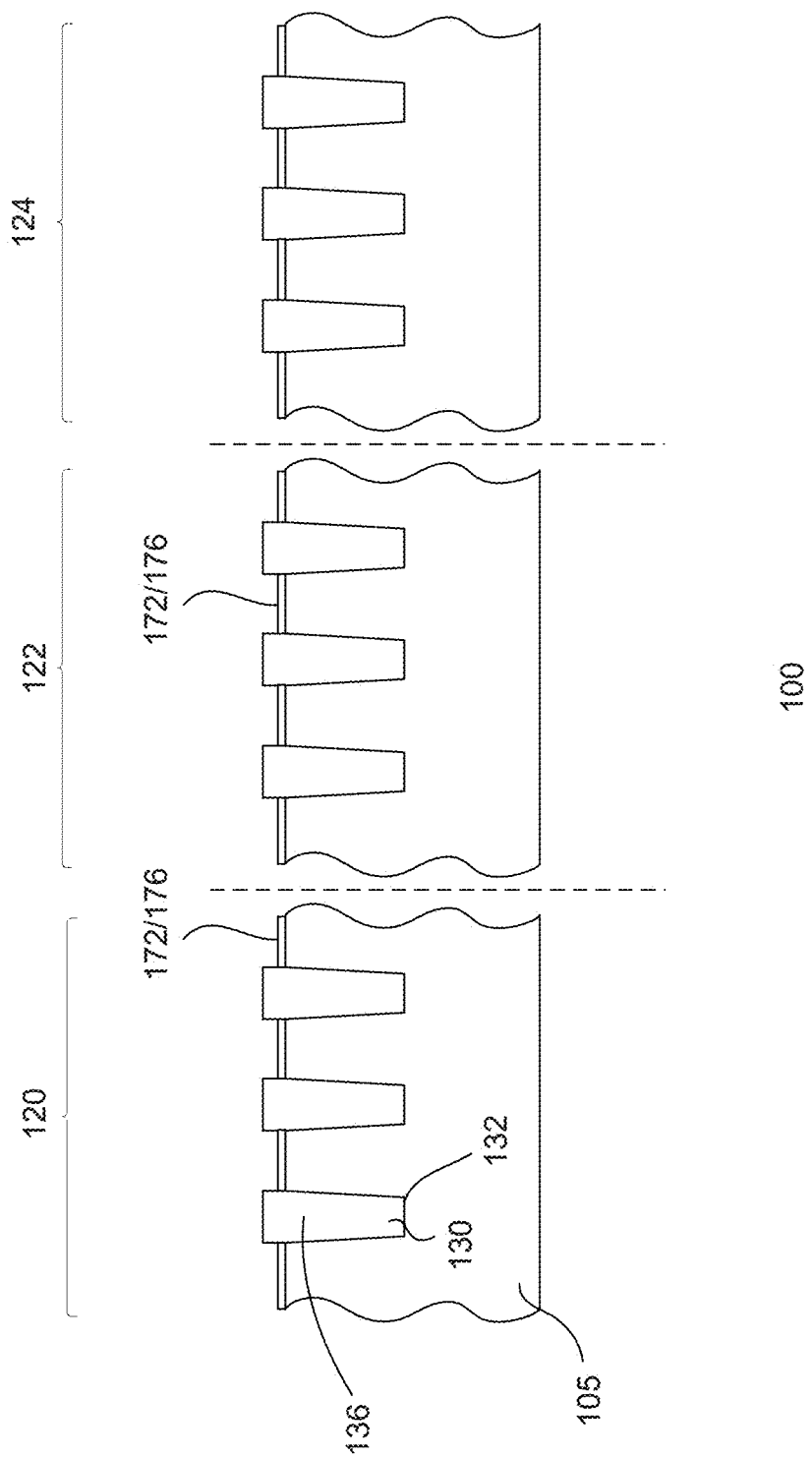
FIGS. 1a-1o show cross-sectional views of an embodiment of a process for forming a device.
Figure 1C:
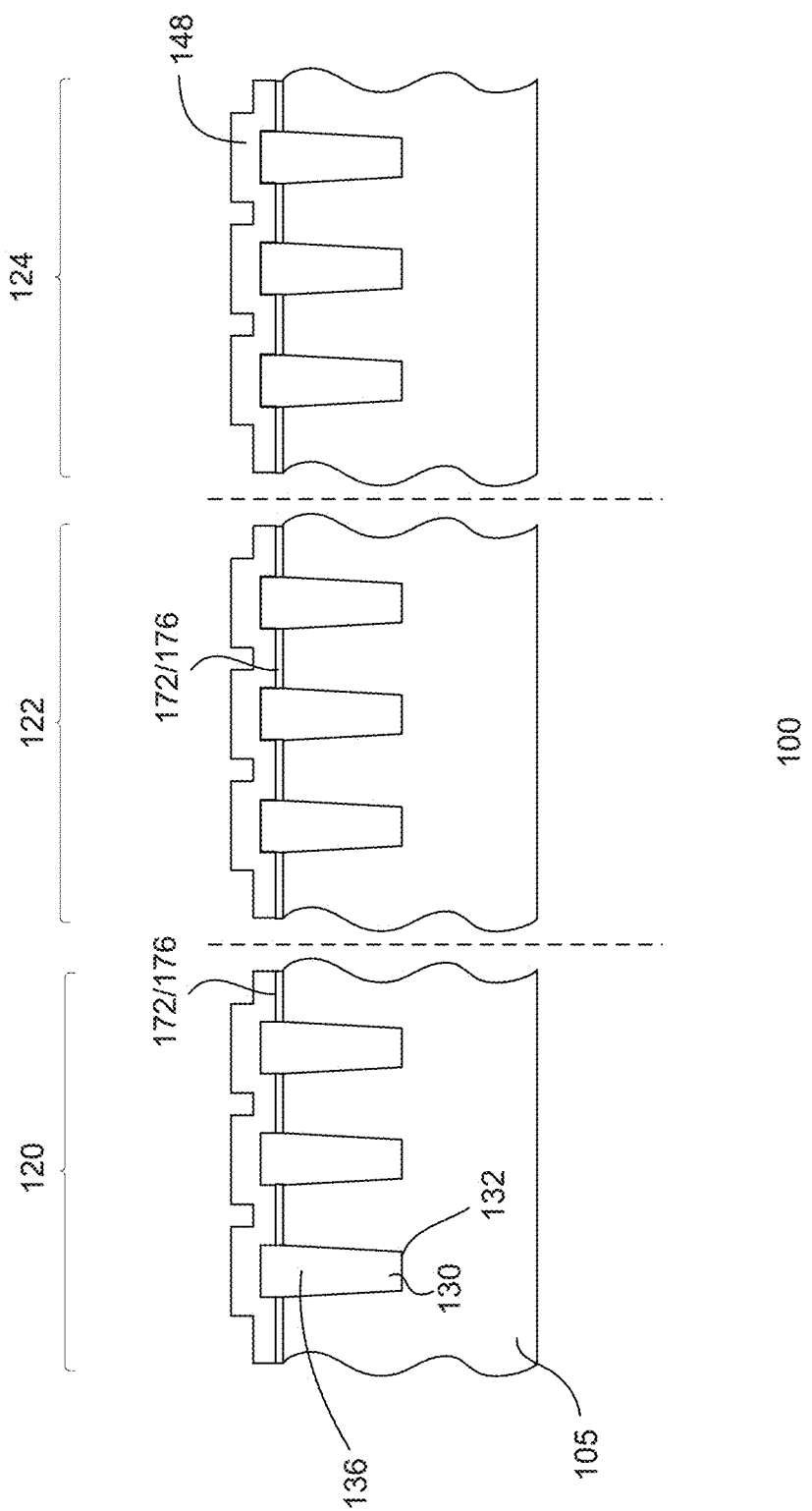
Figure 1E:
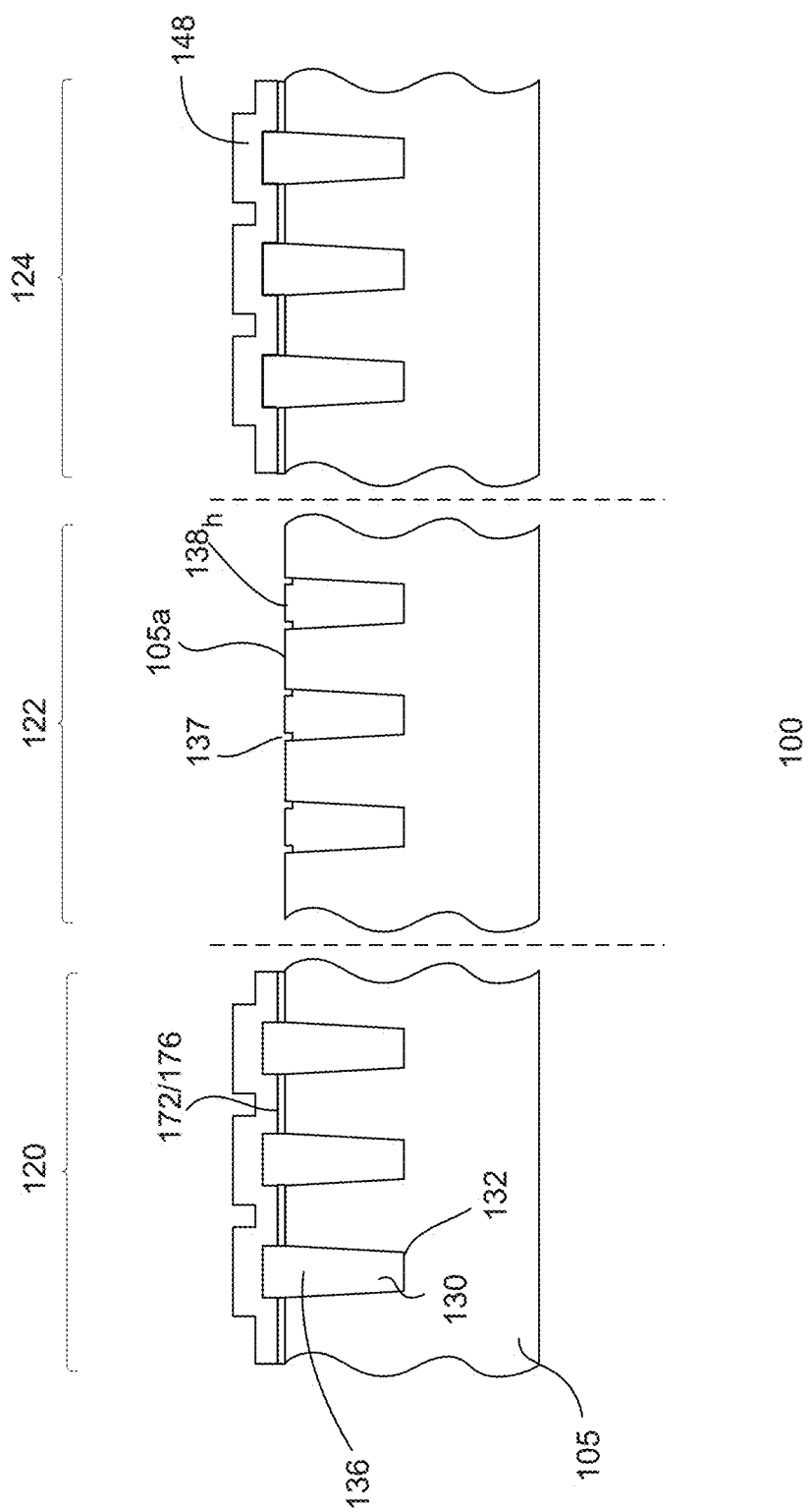
Figure 1F:
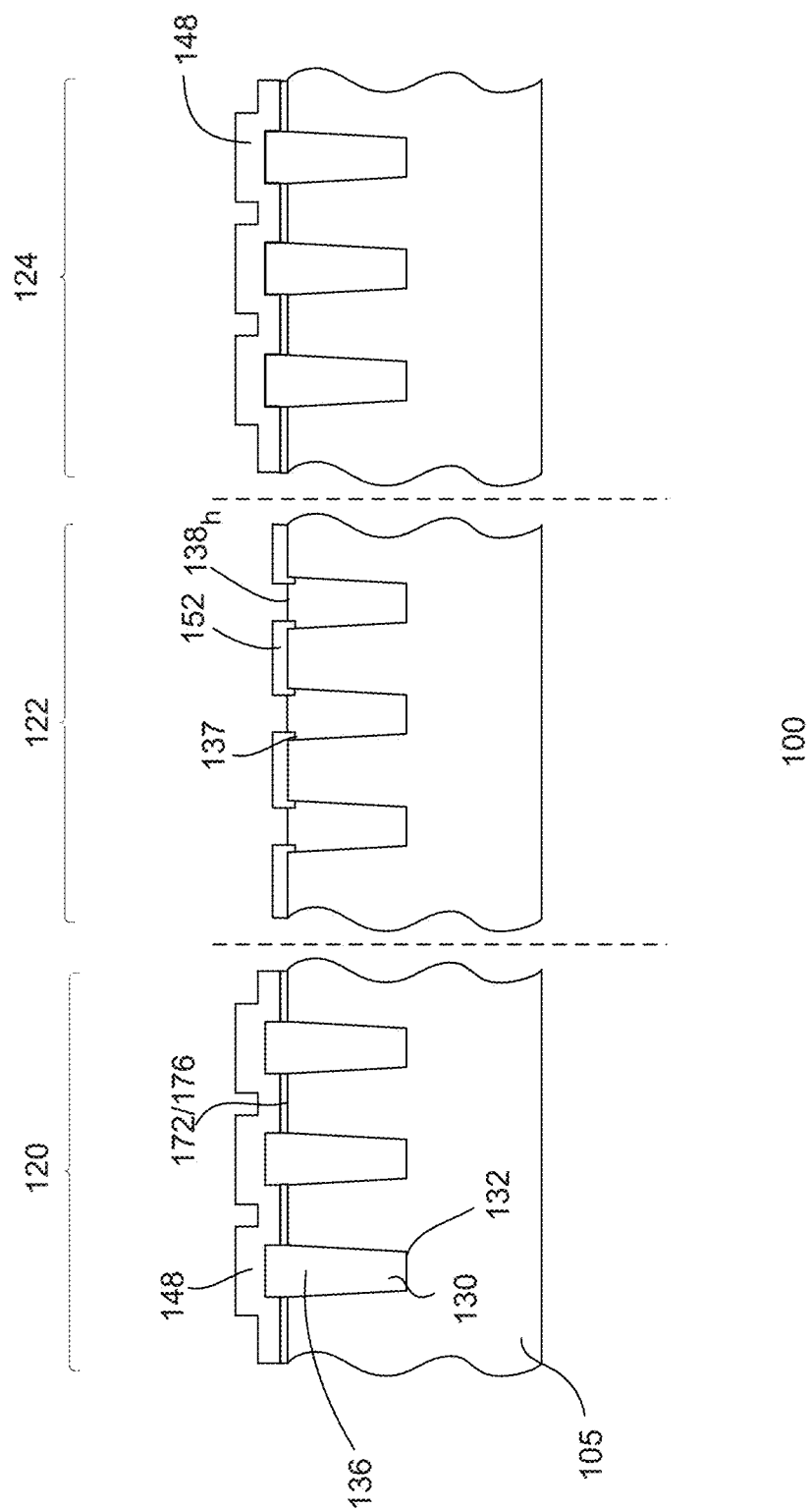
Figure 1G:
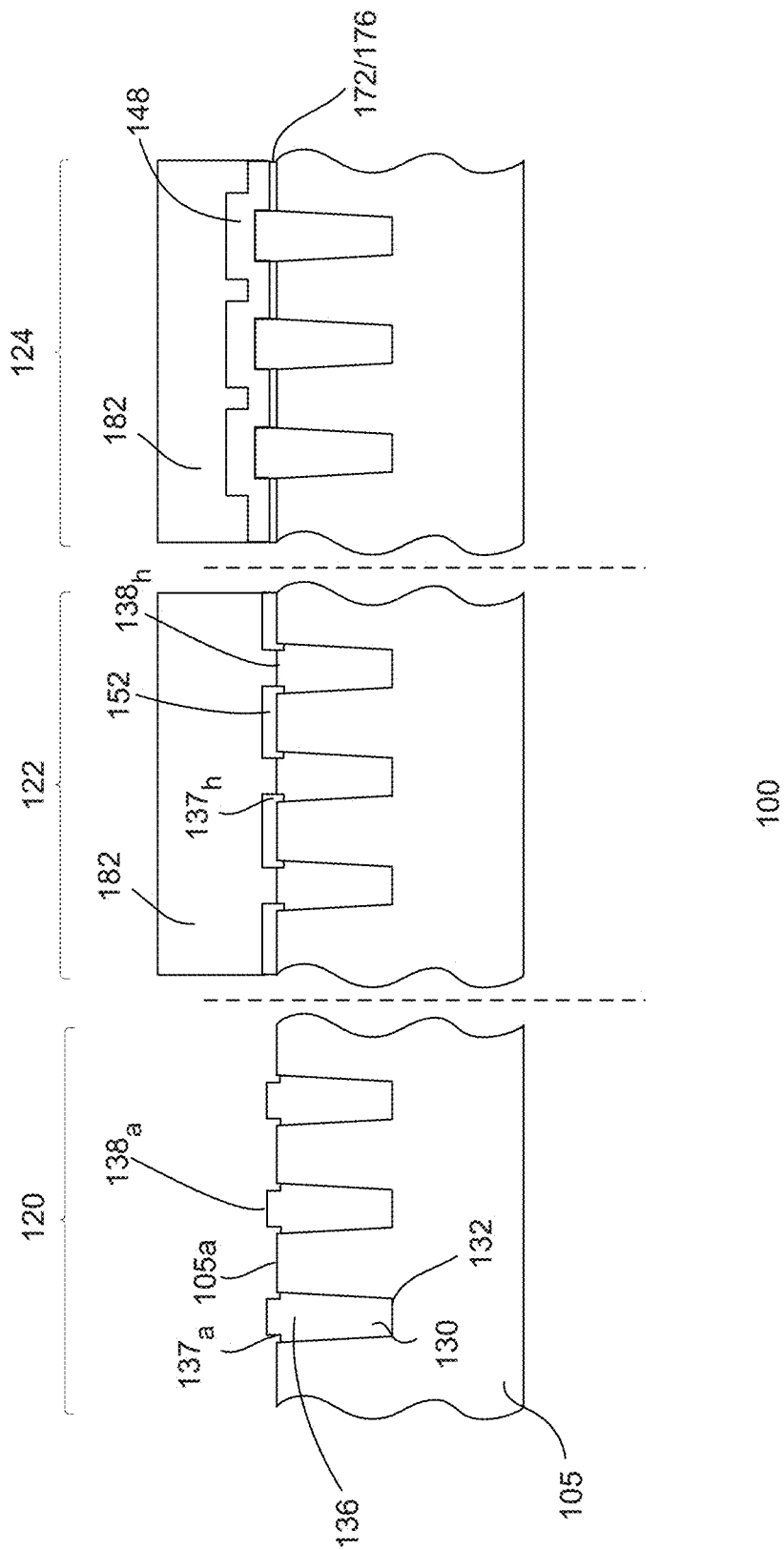
Figure 1H:
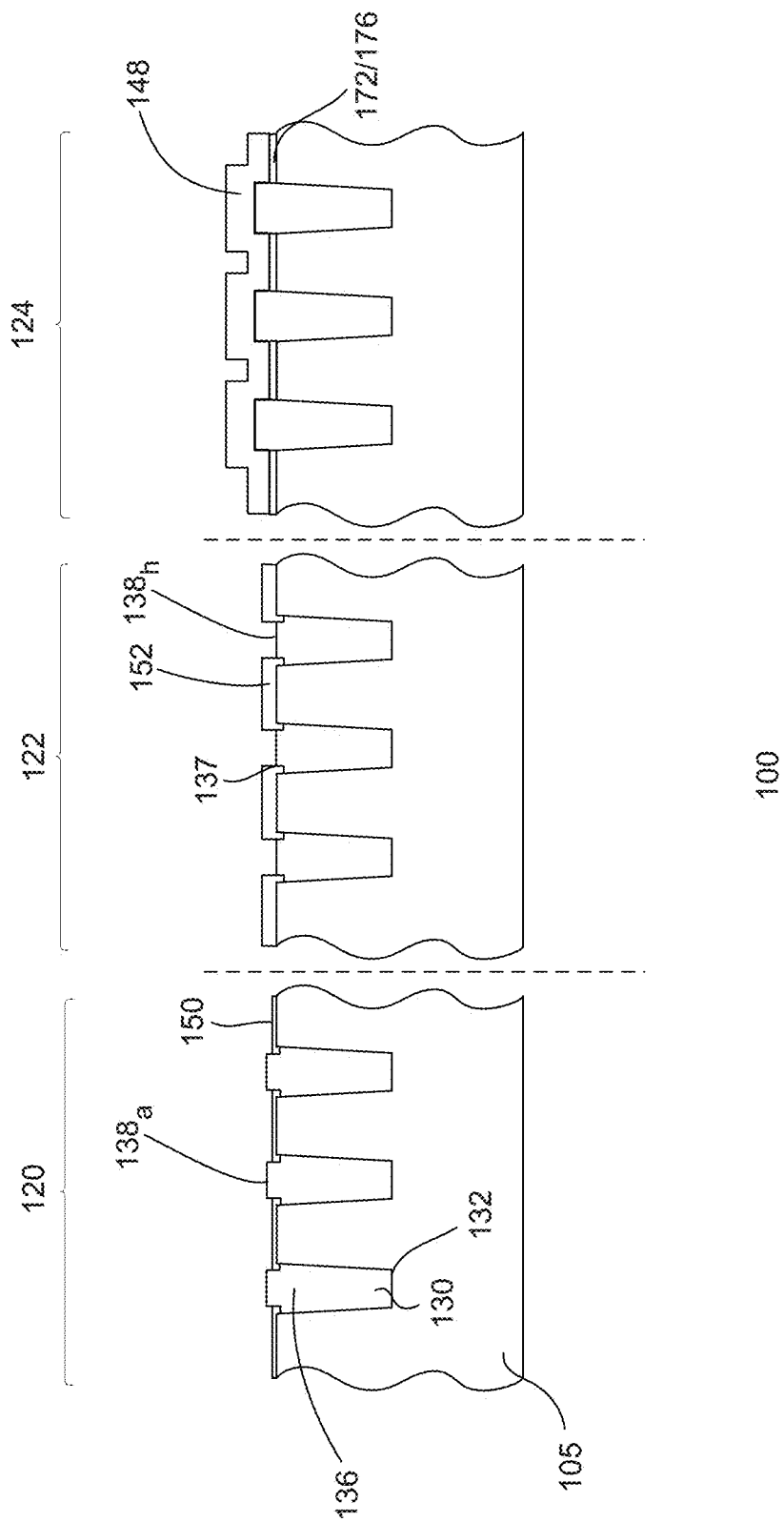
Figure 1J:
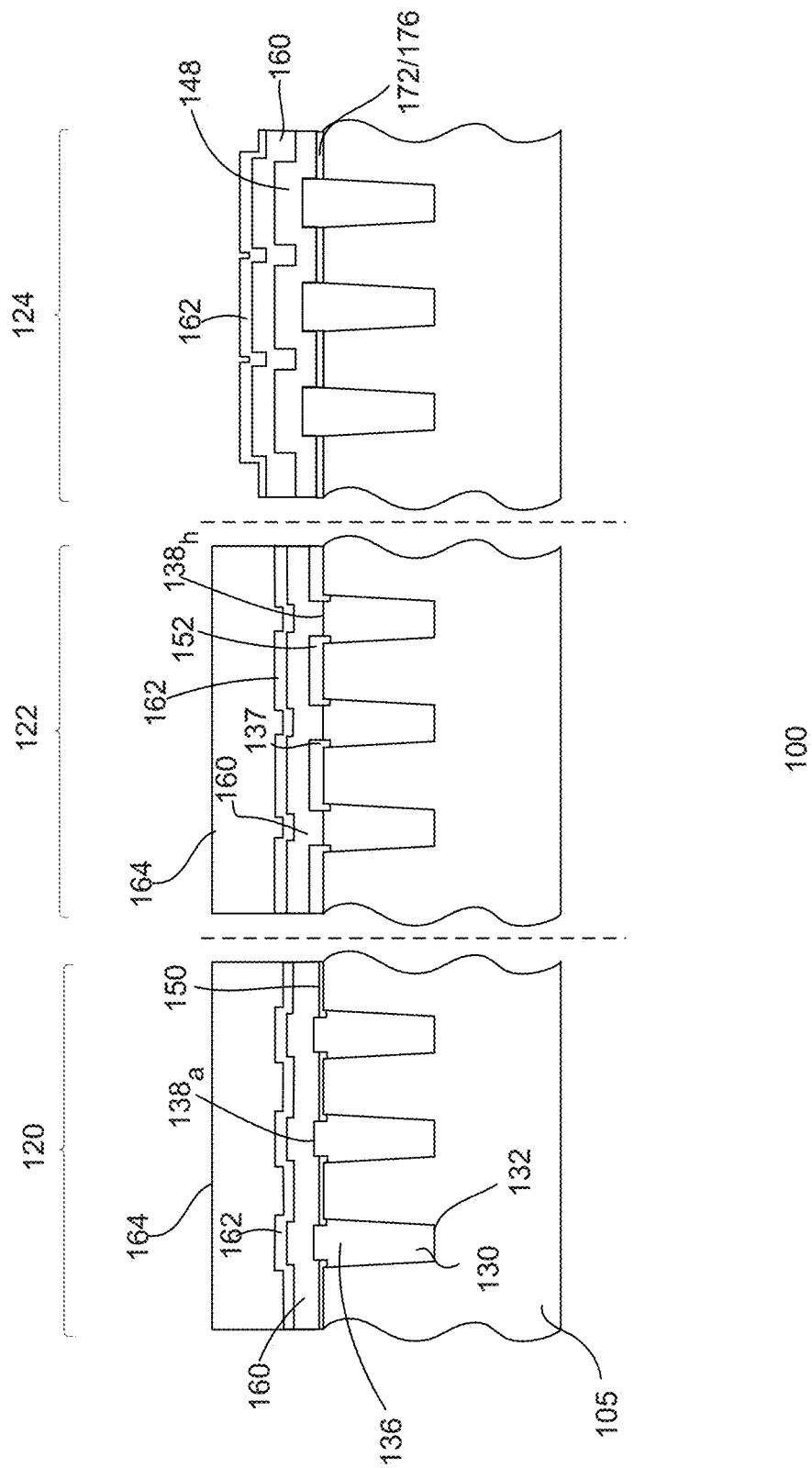
Figure 1K:
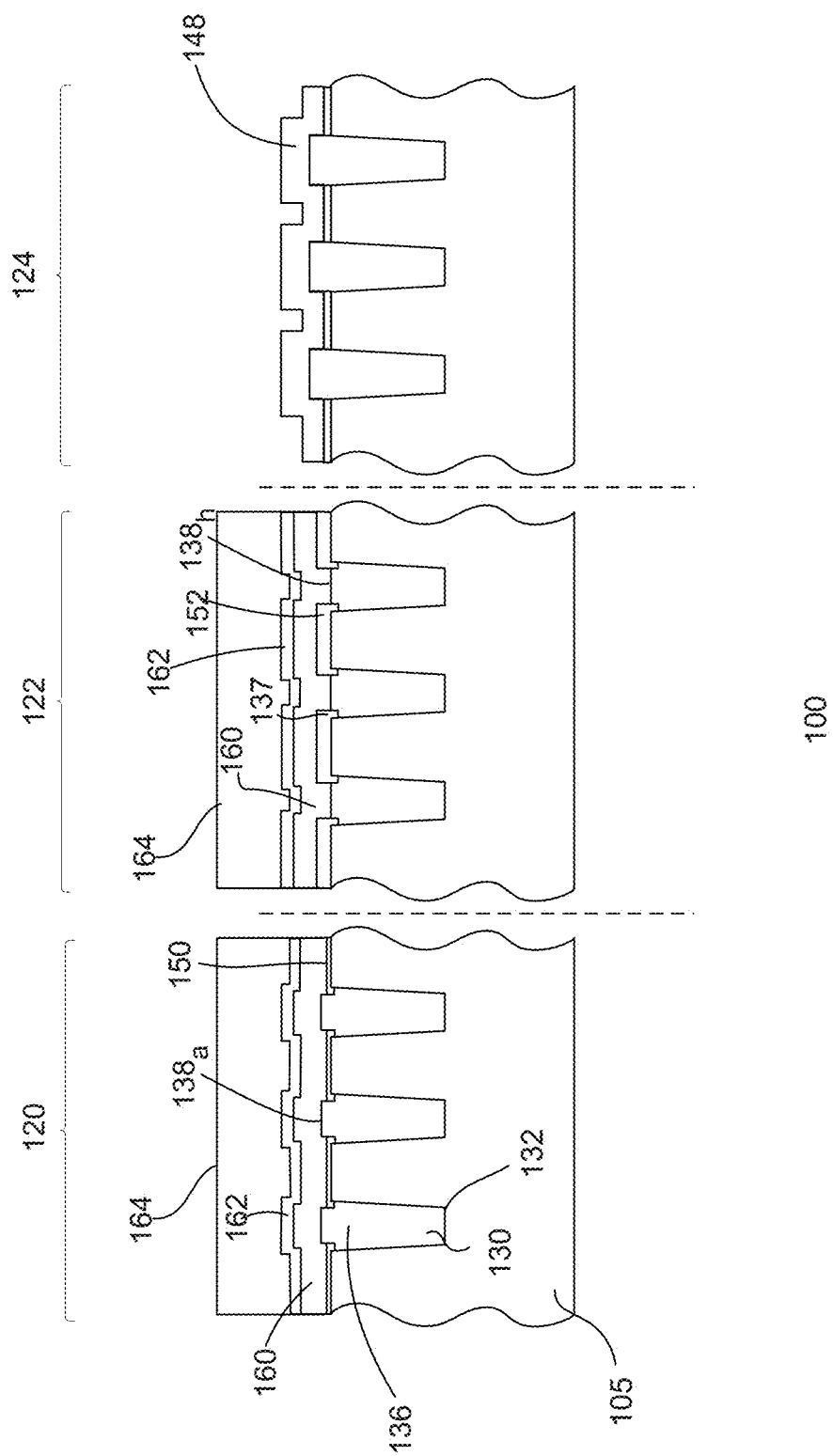
Figure 1I:
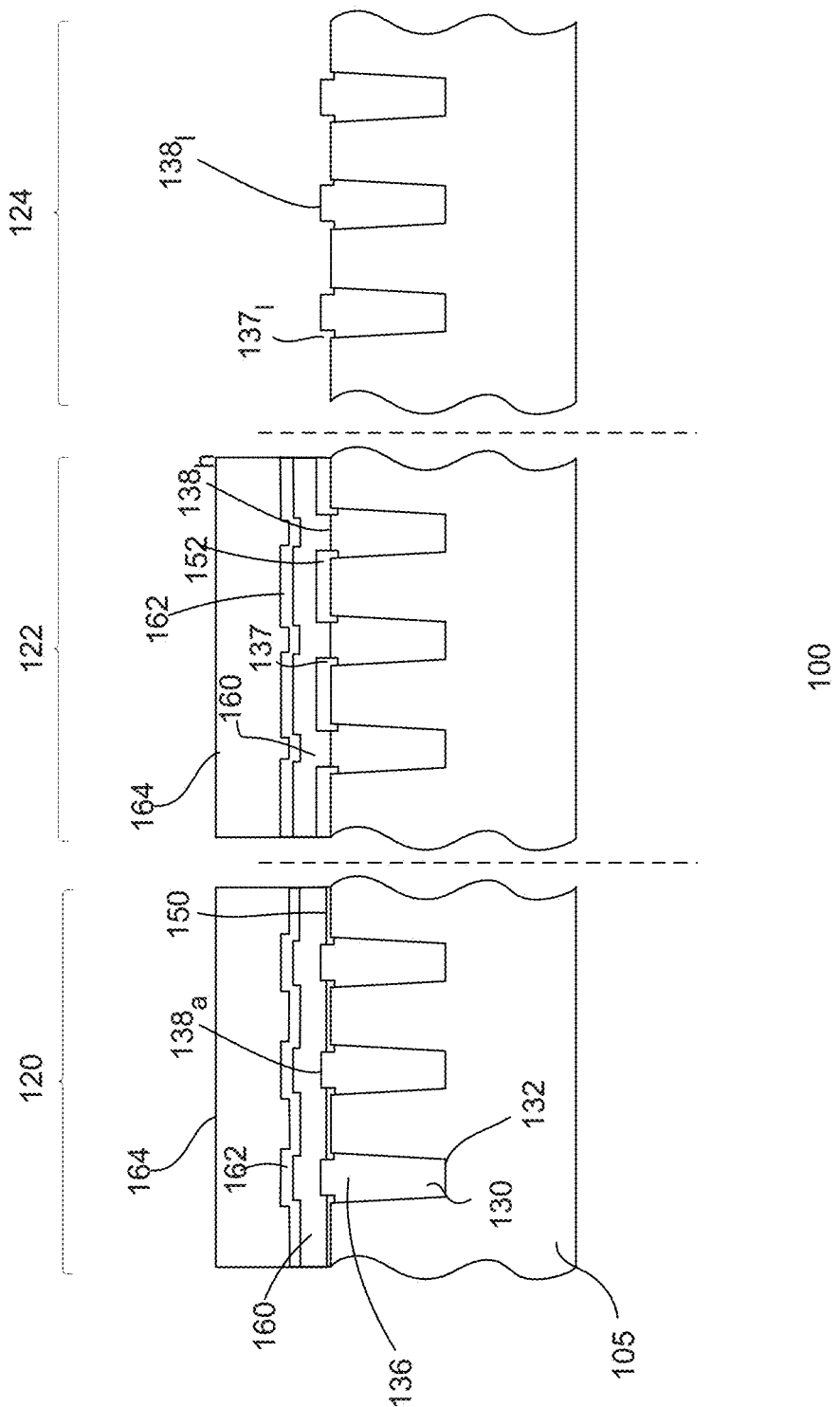
Figure 1M:
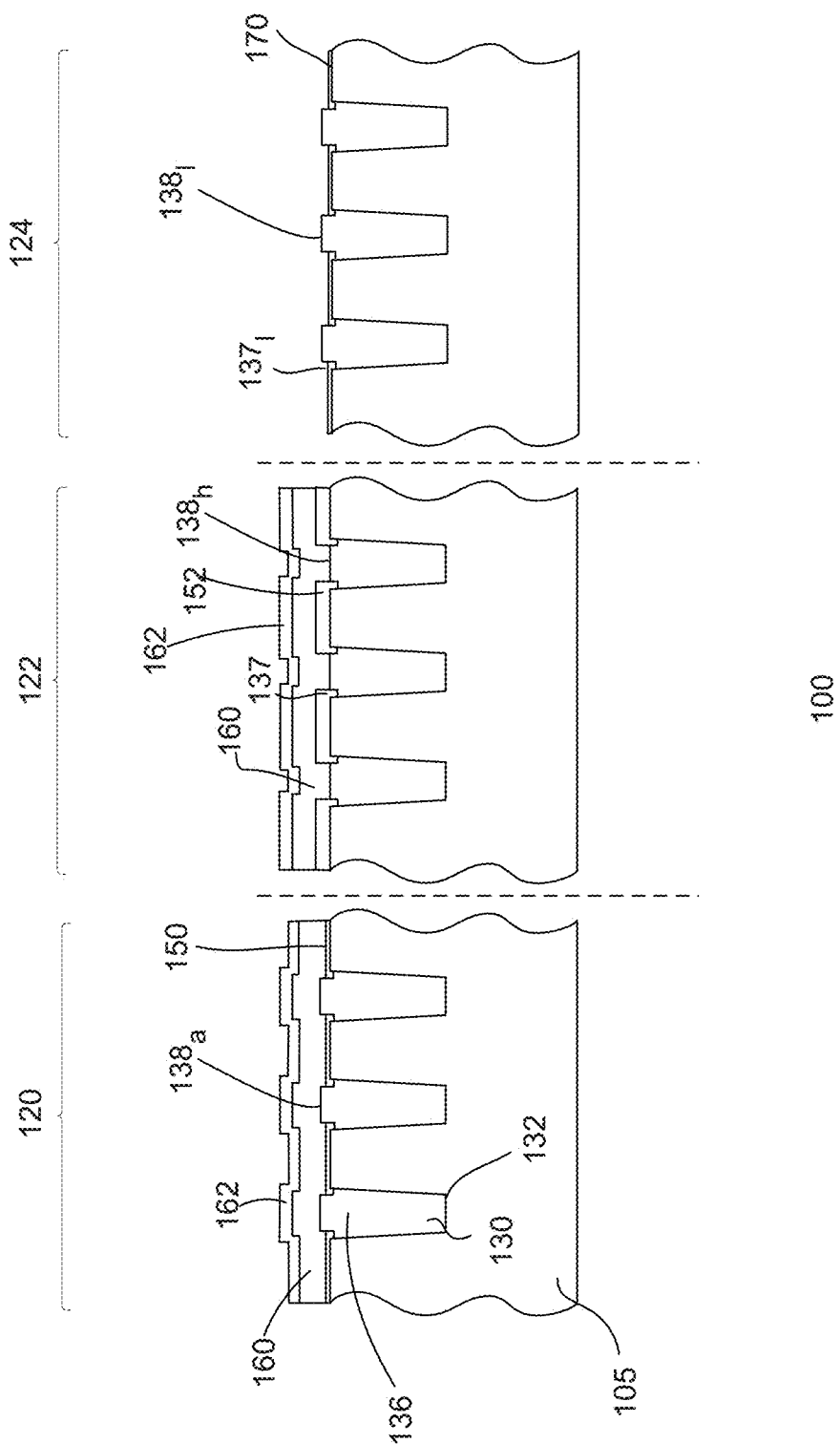
Figure 1N:
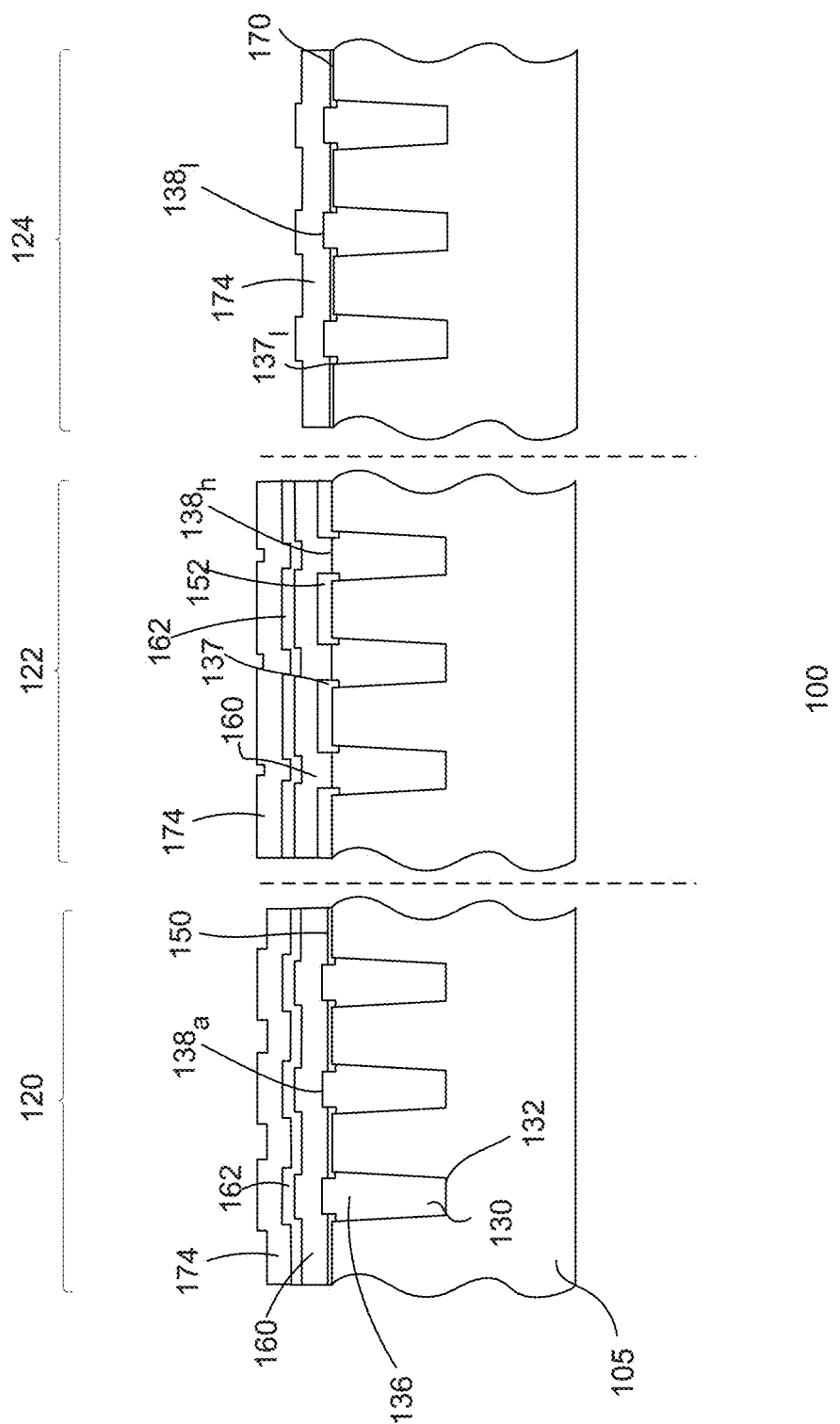
Figure 1O:
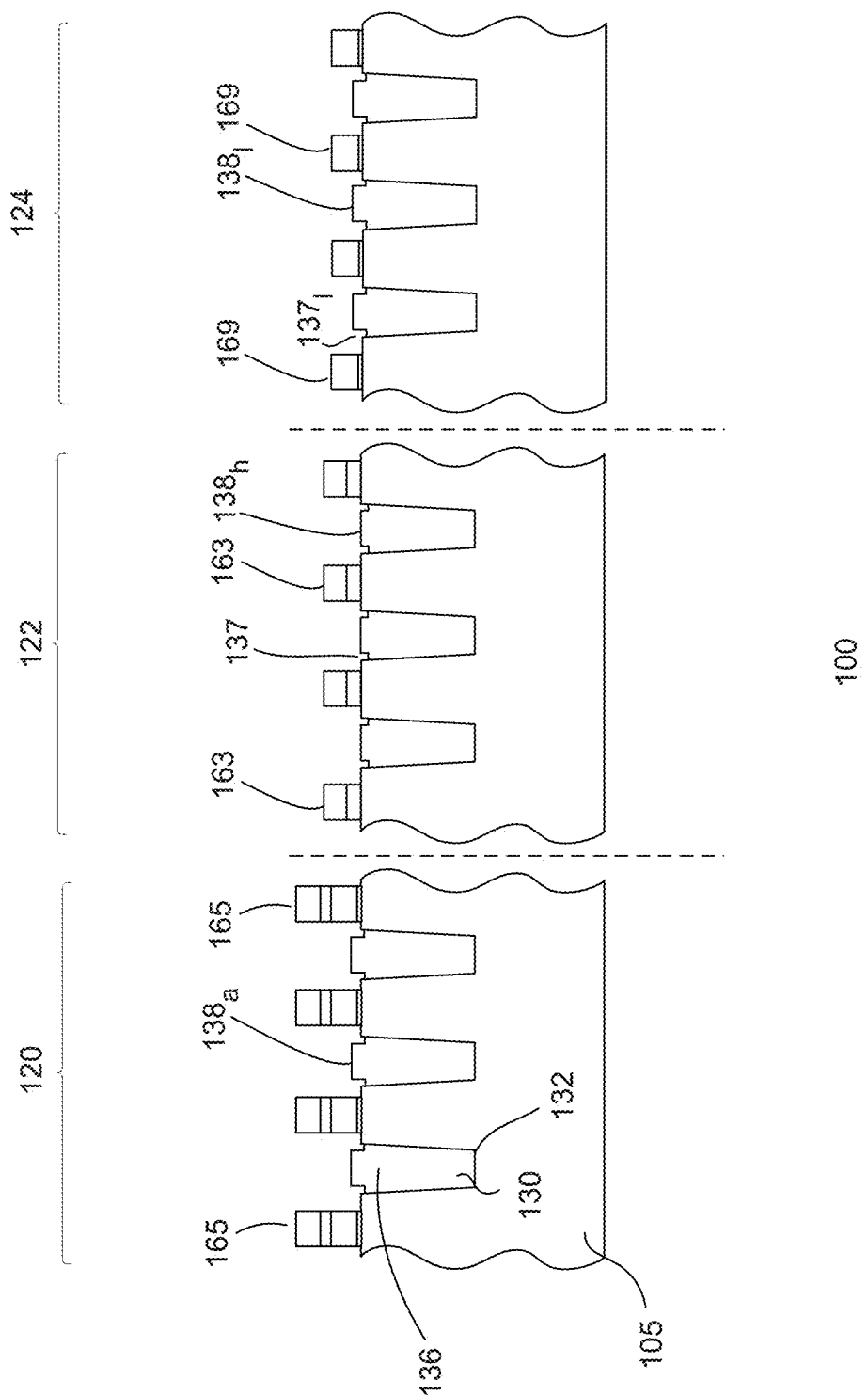

FIGS. 1a-1o show cross-sectional views of a process for forming a device 100. As shown, a substrate 105 having first and second major surfaces 105a-105b is provided. The first surface 105a, for example, may be referred to as the top surface while the second surface 105b, for example, may be referred to as the bottom surface. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations. Illustratively, the substrate as shown includes first, second and third device regions 120, 122 and 124. The different regions are for different types of devices. It is understood that the substrate may include other numbers of device regions.

In one embodiment, the first device region 120 is an array region for memory devices. For example, the array region may include non-volatile memory (NVM) devices. Other types of memory devices may also be useful. As for the second device region 122, it includes high voltage (HV) devices. The third device region 124 serves as a region for logic devices. In one embodiment, different types of devices have different gate dielectric thicknesses.

The substrate is prepared with isolation regions 130. The isolation regions, for example, are shallow trench isolation (STI) regions. The STI regions, for example, serve to isolate a device region from other device regions. Various processes can be employed to form the STI regions. For example, the substrate can be etched using etch and mask techniques to form trenches 132 which are then filled with a dielectric material 136, such as silicon oxide. A planarizing process is used to remove excess dielectric material. For example, a chemical mechanical polishing (CMP) can be performed to remove excess dielectric material and provide a planar substrate top surface. Other techniques for forming the STI regions may also be useful.

In one embodiment, a patterned hard mask 171 is disposed on the substrate. The hard mask may be a hard mask stack which includes a pad oxide layer 172 and a pad nitride layer 173. The pad oxide may be formed by thermal oxidation while the pad nitride may be formed by chemical vapor deposition (CVD). The pad nitride or upper layer of the mask stack serves as the mask while the pad oxide promotes adhesion of the upper layer to the substrate. Other suitable types of hard masks or forming techniques may also be useful. For example, other materials which can be removed selectively to the dielectric material filling the STI regions are also useful.

The patterned hard mask is used to etch the substrate to form the trenches 132. For example, the substrate exposed by openings in the hard mask stack are removed by a reactive ion etch (RIE). Patterning the hard mask maybe achieved by using a photoresist mask (not shown). For example, a photoresist is patterned exposing it with an exposure source using a reticle with the desired pattern. After exposure, the photoresist is developed, transferring the pattern of the reticle to the photoresist. The patterned photoresist is then used as an etch mask to pattern the hard mask 171.

In one embodiment, the CMP which removes excess dielectric material of the STI regions use the hard mask as a polish stop. For example, the dielectric material 136 forms a substantially coplanar top surface with the hard mask 171.

In one embodiment, the process continues to remove the hard mask. In one embodiment, the pad nitride layer is removed, leaving the pad oxide layer remaining on top of the substrate surface. Removal of the pad nitride layer may be achieved by, for example, a wet etch selective to the pad oxide layer and dielectric material of the STI regions. Other suitable techniques of removing the pad nitride layer may also be useful. In one embodiment, a stripping process may be performed to remove the remaining pad oxide layer to expose the top surface of the substrate and an oxide growth process may be performed subsequently to form a sacrificial oxide layer 176 for well implant to form device wells (not shown) in the first, second and third device regions, such as memory, HV, and logic device regions, as shown in FIG. 1b. Implant masks may be used to form the device wells in the first, second and third device regions. The pad oxide layer, for example, may be removed by a wet etch process, such as HF. Other suitable techniques may be employed for the stripping process. The stripping process may also partially reduce the thickness of the protruded STI regions after removal of the pad nitride layer. In another embodiment, the remaining pad oxide layer 172 may not be removed and may serve as the sacrificial oxide layer.

In one embodiment, an additional dielectric layer 148 is formed on the substrate, covering the substrate 105 and STI regions 130 as shown in FIG. 1c. The additional dielectric layer, in one embodiment, is the same as the dielectric material filling the STI regions. For example, the additional dielectric layer 148 is a silicon oxide layer. Other suitable types of dielectric material may also be used. The additional dielectric layer is formed by, for example, CVD or high aspect ratio process (HARP) CVD. Other techniques for forming the additional dielectric layer may also be useful. The additional dielectric layer increases a height of the dielectric material of the STI regions. The thickness of the additional dielectric layer should be sufficient to serve as an effective protection layer to prevent oxygen from penetrating during subsequent processing, such as during gate dielectric formation later. In addition, the thickness of the additional dielectric layer should not be too thick as thicker layer requires more chemical for removal later which increases the manufacturing costs. As such, the thickness of the additional dielectric layer should be sufficient to achieve both results. For example, the thickness of the additional dielectric layer is about 300-800 Å. The thickness of the additional dielectric layer, for example, is about 500 Å. Other suitable thicknesses may also be useful.

An anneal process may be performed after formation of the additional dielectric layer 148. The anneal should be conducted at suitable temperature range to avoid voids and to densify the additional dielectric layer. The anneal process enhances the quality of the additional dielectric layer such that it is about the same quality as the underlying STI material. The temperature of the anneal process is about 900-1100° C. Other suitable temperature may also be employed.

In FIG. 1d, a device region is selectively processed. For example, one of the device regions is processed while the other regions are not. As discussed, different regions have different gate dielectric thicknesses. In one embodiment, the regions are processed in sequence based on gate dielectric thickness. In one embodiment, the regions are processed in sequence from the thickest gate dielectric to the thinnest. For the case where two regions may include the same type of gate dielectrics, they can be processed together. For example, such regions may be considered to be the same type of regions, at least with respect to gate dielectrics.

To protect the non-selected region or regions from being processed, a mask layer 180 may be provided. The mask protects the non-selected regions while leaving the selected region exposed. In one embodiment, the mask includes a photoresist mask. The mask layer, for example, may also include a nitride mask. Other suitable types of masks may also be useful.

FIG. 1e illustrates selectively processing of one of the device regions (select region). For example, the HV region 122 is the select region which is selectively processed. In one embodiment, the processing of the select region includes removal and pre-clean processes. The removal process, in one embodiment, includes wet etch and wet clean processes. For example, an isotropic wet etch process is used to remove the additional dielectric layer 148 while a wet clean process is adopted to remove organic moieties from the select region. The wet etch, for example, employs HF solution while the wet clean employs SPM ($H_2SO_4/H_2O_2$ mixture). Other suitable types of removal techniques may also be employed.

The removal process, in one embodiment, reduces the height (a top surface 138h) of the STI regions and removes the oxide layer or native oxide to expose the surface of the substrate. Divots 137, for example, may be formed at the edge of the STI regions. The top surfaces of the STI regions are recessed to a desired height. The desired height, for example, may refer to the desired thickness of the STI regions suitable for HV devices. Recessing the top surface of the STI regions to other heights may also be useful. The mask layer 180 protects the non-select regions during the removal process. For example, the mask layer 180 protects the array and logic regions 120 and 124. As such, the surface of the substrate in the array and logic regions is not exposed during processing of the HV region. The mask layer 180 may be consumed or stripped during the removal process.

A pre-clean process may be performed on the select region prior to formation of gate dielectric layer over the select region as will be described later. The pre-clean process, in one embodiment, prepares the surface of the substrate for formation of gate dielectric layer later. The pre-clean process, for example, employs SC1 and SC2 clean processes. Other suitable types of pre-clean techniques may also be used.

Referring to FIG. 1f, a gate dielectric layer such as a gate oxide layer 152 is formed in the select region. In one embodiment, a HV gate oxide layer is selectively formed in the select region. For example, the HV gate oxide layer forms on the exposed active areas of the HV region. Forming the gate oxide layer may include selective thermal oxidation. Thermal oxidation may include wet thermal oxidation, dry thermal oxidation or a combination of both. The thickness of the HV oxide formed $T_{HI}$, for example, may not be the final thickness $T_{HF}$. For example, processing of other regions may further add to the thickness.

In one embodiment, processing the HV region forms a HV oxide with a first HV oxide thickness $T_{HI}$. The final thickness $T_{HF}$ of the HV oxide is the desired gate oxide thickness of the HV device. The final thickness $T_{HF}$ of the HV oxide may be about 200-1000 Å. For example, the final thickness $T_{HF}$ of the HV oxide is about 250 Å. Other suitable thickness ranges may also be useful, depending on voltage requirement of the HV device.

In FIG. 1g, processing of another select region is performed. The select region is the region in which the gate oxide thickness is the next thickest. For example, the select region includes a gate oxide having a thickness which is second to the HV oxide. In one embodiment, the select region is the array region 120. The non-select regions, such as the HV and logic regions 122 and 124, are protected by a mask layer 182.

The array region 120 is processed. Similar to the HV region 122, removal and pre-clean processes are performed on the array (select) region 120. The removal process removes the additional dielectric layer 148 in the array region and, in one embodiment, reduces the height of the STI regions to a desired thickness and removes the oxide layer to expose the surface of the substrate, serving as active areas of the array region. The removal and pre-clean processes, for example, may be the same as the removal and pre-clean processes as described in FIG. 1e above. Other suitable types of removal and pre-clean techniques may also be used. Divots $137_a$ may be formed at the edge of the STI regions protruded above the substrate surface 105a. The top surfaces of the STI regions are recessed to a desired height. The desired height, for example, may refer to the desired thickness of the STI regions suitable for the memory device which also takes into consideration the desired step height. Step height, for example, refers to the difference between the height of the STI region and the height of the memory gate dielectric or oxide which is formed later with reference to the bottom surface of the substrate. As shown, the thickness of the STI regions in the array (select) region and the divots $137_a$ may be tuned to the desired height by the removal process. For example, the top surface of the STI regions $138_a$ is disposed above the substrate surface 105a. Recessing the top surface of the STI regions to other heights may also be useful. The mask layer 182 may be consumed or stripped during the removal process.

A gate dielectric such as a gate oxide layer 150 is formed on the surface of the substrate in the array (select) region, as shown in FIG. 1h. In one embodiment, the gate dielectric 150 corresponds to a memory gate oxide layer, such as a NVM gate oxide layer, which is selectively formed in the select region. For example, the memory gate oxide layer is selectively formed on exposed active areas of the array region 120. Forming the memory gate oxide layer may include selective thermal oxidation. Thermal oxidation may include wet thermal oxidation, dry thermal oxidation or a combination of both. The thickness of the memory oxide formed $T_{MI}$, in one embodiment, is not the final thickness $T_{MF}$. For example, processing of other regions may further add to the thickness of the gate oxide layer 150.

In one embodiment, processing the array region forms a memory gate oxide with a first memory gate oxide thickness $T_{MI}$. The final thickness $T_{MF}$ of the memory gate oxide is the desired gate oxide thickness of the memory device. The final thickness $T_{MF}$ of the memory gate oxide may be about 50-200 Å. For example, the final thickness $T_{MF}$ of the memory gate oxide is about 100 Å. Other suitable thickness ranges may also be useful, depending on requirement of the memory device. As shown, in one embodiment, the top surface of the STI region is higher than the top surface of the memory gate oxide. Thus, a positive step height is achieved. In another embodiment, the thickness of the STI region may be tuned such that the top surface of the STI region is substantially coplanar with the top surface of the memory gate oxide.

After forming the gate oxide layer 150 in the memory region, the process continues to form a first gate electrode layer 160 over the substrate as shown in FIG. 1i. The first gate electrode layer, for example, includes polysilicon. Other suitable types of gate electrode materials may also be useful. For example, the polysilicon can be implanted or in-situ doped with dopants such as P to form a doped polysilicon. The thickness of the first gate electrode layer may be about 500 Å. Other suitable thickness dimensions may also be useful. Various techniques can be used to form the first gate electrode layer. For example, the first gate electrode layer can be deposited by CVD. Other techniques, depending on the material, may also be useful.

Referring to FIG. 1j, a storage layer 162 is formed. Typically, the storage layer is formed as a blanket layer on the substrate, covering the array, HV and logic regions. The storage layer, in one embodiment, includes a composite layer stack. In one embodiment, the composite layer stack includes an oxide-nitride-oxide (ONO) stack. Other suitable types of charge storage layer are also useful. Conventional techniques can be used to form the ONO stack. In one embodiment, a tunneling oxide layer is first formed. The tunneling oxide layer can be formed by, for example, rapid thermal oxidation (RTO). Other suitable techniques including, for example, low pressure chemical vapor deposition (LPCVD) and thermal oxidation are also useful. Next, a nitride layer is deposited. The nitride layer can be formed by LPCVD or nitridation. Other suitable techniques are also useful. Finally, the top or barrier oxide layer is formed. The barrier oxide layer may be formed using the same techniques as for the tunneling oxide layer. Any suitable thickness dimensions may be used for the respective tunneling oxide, nitride and top oxide layers.

The process continues by providing a mask layer 164. The mask layer protects the array and HV regions while leaving the logic region exposed. In one embodiment, the mask includes a photoresist mask. The mask layer, for example, may also include a nitride mask. Other suitable types of mask may also be useful.

FIG. 1k illustrates processing the logic region. In one embodiment, the processing of the logic region includes a removal process. The removal process, in one embodiment, includes a dry etch process. For example, the dry etch process is used to remove the ONO stack 162 and the first gate electrode layer 160 in the logic region, exposing the additional dielectric layer 148. Other suitable techniques may also be used to remove the ONO stack and the first gate electrode layer. The additional dielectric layer 148, for example, serves as an etch stop layer.

Referring to FIG. 1l, processing of another select region is performed. The select region is the region in which the gate oxide thickness is the thinnest. For example, the select region includes a gate oxide having a thickness which is thinner than the memory and HV oxides. In one embodiment, the select region is the logic region 124. The non-select regions, such as the array and HV regions 120 and 122, are protected by the mask layer 164.

Similar to the array and HV regions 120 and 122, removal and pre-clean processes are performed on the logic (select) region 124. The removal process removes the additional dielectric layer 148 in the logic region and, in one embodiment, reduces the height of the STI regions to a desired thickness and removes the oxide layer to expose the surface of the substrate, serving as active areas of the logic region. The removal and pre-clean processes, for example, may be the same as the removal and pre-clean processes as described in FIG. 1e above. Other suitable types of removal and pre-clean techniques may also be used. Divots $137_l$ may be formed at the edge of the STI regions protruded above the substrate surface 105a. The top surfaces of the STI regions are recessed to a desired height. The desired height, for example, may refer to the desired thickness of the STI regions suitable for the logic device which also takes into consideration the desired step height. Step height, for example, refers to the difference between the height of the STI region and the height of the logic gate dielectric or oxide which is formed later with reference to the bottom surface of the substrate. As shown, the thickness of the STI regions in the logic (select) region and the divots $137_1$ may be tuned to the desired height by the removal process. For example, the top surface of the STI regions $138_1$ is disposed above the substrate surface 105a. Recessing the top surface of the STI regions to other heights may also be useful. The mask layer 164 may be consumed or stripped during the removal process.

A gate dielectric or a gate oxide layer 170 is formed on the surface of the substrate in the logic (select) region, as shown in FIG. 1m. In one embodiment, the gate dielectric 170 corresponds to a logic gate oxide layer formed in the select region. For example, the logic gate oxide layer is selectively formed on exposed active areas of the logic region 124. Forming the logic gate oxide layer may include selective thermal oxidation. Thermal oxidation may include wet thermal oxidation, dry thermal oxidation or a combination of both. The thickness of the logic gate oxide formed $T_{LI}$, in one embodiment, is not the final thickness $T_{LF}$. For example, processing of other regions may further add to the thickness of the gate oxide layer 170.

In one embodiment, processing the logic region forms a logic gate oxide with a first logic gate oxide thickness $T_{LI}$. The final thickness $T_{LF}$ of the logic gate oxide is the desired gate oxide thickness of the logic device. The final thickness $T_{LF}$ of the logic oxide may be about 50 Å. Other suitable thickness ranges may also be useful, depending on requirement of the logic device. As shown, in one embodiment, the top surface of the STI region is higher than the top surface of the logic gate oxide. Thus, a positive step height is achieved. In another embodiment, the thickness of the STI region may be tuned such that the top surface of the STI region is substantially coplanar with the top surface of the logic gate oxide.

After forming the gate oxide layer 170 in the logic region, the process continues to form a second gate electrode layer 174 over the substrate as shown in FIG. 1n. The second gate electrode layer, for example, includes polysilicon. Other suitable types of gate electrode materials may also be useful. For example, the polysilicon can be implanted or in-situ doped with dopants such as P to form a doped polysilicon. The thickness of the second gate electrode layer may be about 500-1500 Å. Other suitable thickness dimensions may also be useful. Various techniques can be used to form the second gate electrode layer. For example, the second gate electrode layer can be deposited by CVD. Other techniques, depending on the material, may also be useful.

The process continues to define and form the memory gates 165, HV gates 163 and logic gates 169 using various suitable masks and etch techniques as shown in FIG. 1o. Additional processes may be performed to complete forming the memory, HV and logic devices. For example, additional processes include forming contacts to the various types of transistors. For example, contact openings are formed to the contact regions. Silicide contacts may be formed on exposed source/drain contact regions. Contact plugs are formed in the contact openings with the silicide contacts. Additional processes may include back end of line process to finish the manufacturing of the device, such as forming of one or more interconnect levels, final passivation, dicing, assembly, packaging and testing. Other processes are also useful.

The embodiments as described above result in advantages. The embodiments as described enable integration of these different devices without degrading the performances of the respective device type. As described, the various regions of the device are processed separately. For example, while processing the select region, the non-select regions are protected. The surface of the substrate in the non-select regions is not exposed during processing of the select region. Further, the additional dielectric layer as described elevates the height of the STI regions. This allows for the final thickness of the STI region to be tuned or controlled according to a desired thickness which takes into consideration the desired step height. The additional dielectric layer also prevents the top surface of the STI regions of the non-select regions to be reduced and divots to be formed below the top surface of the substrate during processing of the select regions. As such, the non-select regions, such as the active substrate surface of the non-select regions will not be consumed during processing of the select regions. This reduces or prevents corner rounding at the active areas of non-select regions, thus minimizing or eliminating top critical dimension (CD) loss in these active areas. The additional dielectric layer enables controllable step height and divots. In addition, gate oxide is also selectively formed on exposed surface of the substrate in the select region. There is also no need to remove gate oxide from the non-select regions. Thus, the embodiment as described provides flexibility in step height tuning and at the same time offers a simplified and reliable integration solution.

Figure 2:
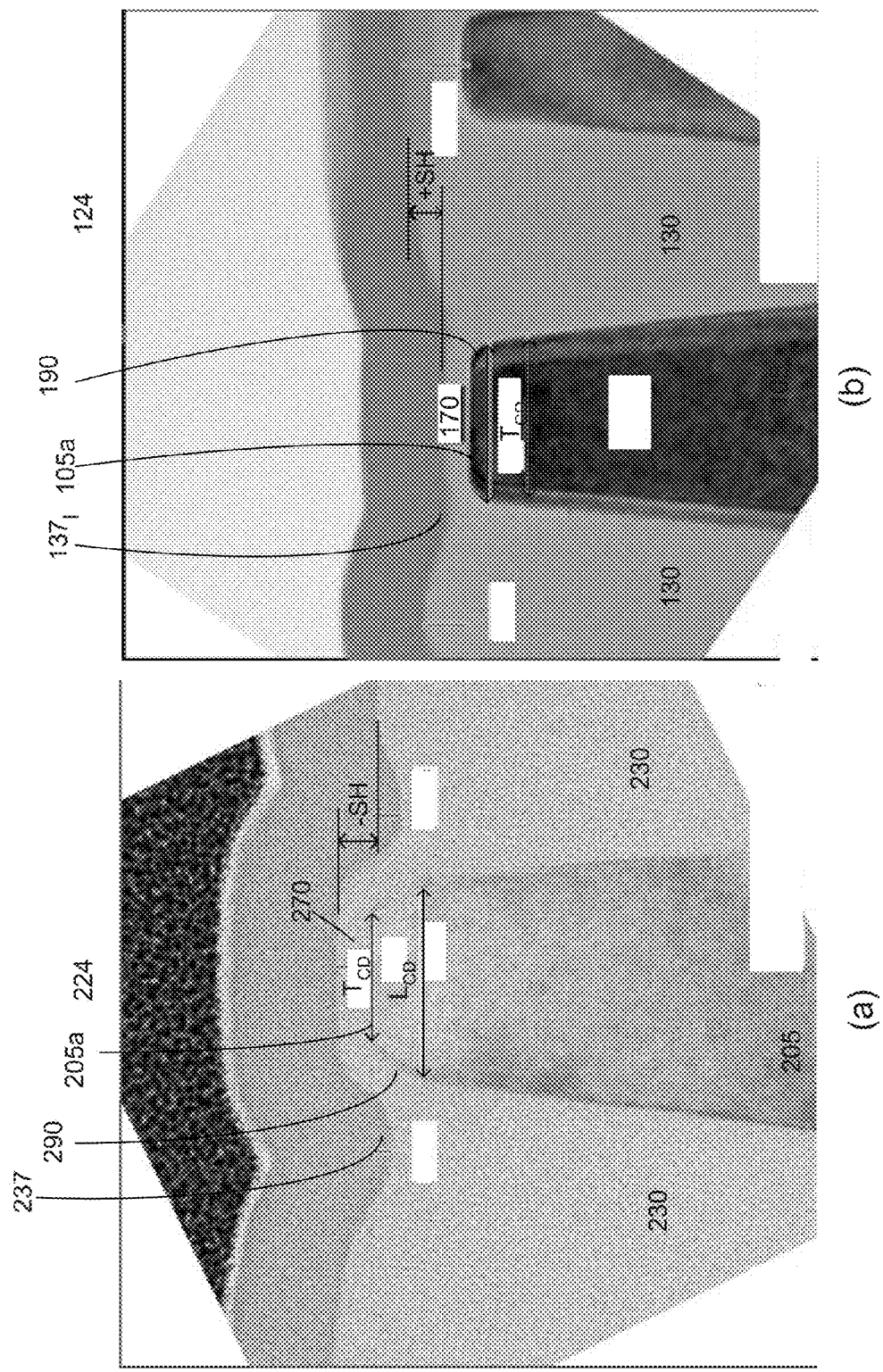
FIG. 2 shows TEM images comparing a) conventional logic region and b) an embodiment of logic region in the present disclosure.

FIG. 2 shows TEM images comparing a) conventional logic region and b) an embodiment of logic region in the present disclosure. As described, some conventional manufacturing processes suitable for use for one type of device may compromise the quality or may not be suitable for the other types of devices. We observed that the conventional logic region 224 formed by conventional manufacturing processes shows top surface of the STI region 230 being recessed below top surface of the logic gate oxide 270, resulting in a negative step height (SH). Negative step height is undesirable as it may be difficult to be refilled to a desired height later. The conventional logic region also exhibits divots 237 which are disposed below the top active substrate surface 205a. The divots expose portions of the active substrate surface. Thus, we discovered that during removal of HV oxide from the logic region which is employed in conventional processing, for example, excessive corner rounding 290 is observed at the active area of the conventional logic region. Excessive corner rounding 290, as shown, is undesirable as it reduces the top active area or top CD ($T_{CD}$) relative to lower part of the active area ($L_{CD}$) of the logic region.

As for the logic region 124 in accordance with an embodiment of the present disclosure, it is protected during processing of non-logic regions. As such, no active substrate or active area is exposed during processing of the non-logic regions as well as no HV gate oxide removal step is required so that consumption of active area of the logic region is reduced or minimized. Thus, as shown, excessive corner rounding 190 at the active area of the logic region in accordance with an embodiment of the present disclosure is reduced or eliminated. This advantageously results in increased active CD area. For example, as shown, the width of the top active area or top CD ($T_{CD}$) relative to the width of the lower part of the active area ($L_{CD}$) of the logic region is substantially the same. Further, the process in accordance with the embodiment as described results in good step height (SH) and divot $137_1$ profile. The additional dielectric layer as described allows for step height and divots to be controlled or tuned as desired, allowing for more margin for device tuning.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate prepared with isolation regions, wherein the substrate comprises at least first, second and third regions, the first region comprises a memory region, the second region comprises a high voltage (HV) region and the third region comprises a logic region;
   forming an additional dielectric layer in direct contact with the substrate and the isolation regions;
   selectively processing a first select region while protecting first non-select regions, wherein the first select region is one of the first, second and third regions, and wherein selectively processing the first select region comprises performing a removal process to remove the additional dielectric layer over the first select region and to reduce a height of the isolation regions in the first select region; and
   forming a first gate dielectric on the select region, wherein top substrate active area and isolation regions of the first non-select regions are not exposed during processing of the first select region and forming the first gate dielectric.

2. The method of claim 1 wherein the first select region is the HV region.

3. The method of claim 2 wherein the additional dielectric layer comprises the same material as the isolation region, and wherein the additional dielectric layer and the first gate dielectric are separate dielectric layers.

4. The method of claim 2 wherein the first non-select regions are the memory and logic regions and the non-select regions are protected by a mask layer.

5. The method of claim 4 wherein:
   the additional dielectric layer elevates height of the isolation regions and prevents top surface of the isolation regions of the non-select regions to be reduced and divots to be formed below top surface of the substrate during processing of the first select region; and
   the top substrate active area and isolation regions of the first non-select regions are not consumed such that a width of the top active substrate area and a width of the lower active substrate area of the first non-select regions are about the same.

6. A method of forming a device comprising:
   providing a substrate prepared with isolation regions, wherein the substrate comprises at least first, second and third regions, the first region comprises a memory region, the second region comprises a high voltage (HV) region and the third region comprises a logic region;
   forming an additional dielectric layer covering the substrate and the isolation regions;
   selectively processing a first select region while protecting first non-select regions, wherein the first select region is the HV region and the first non-select regions are the memory and logic regions and the non-select regions are protected by a mask layer, and wherein selectively processing the first select region comprises performing a removal process to remove the additional dielectric layer over the first select region and to reduce a height of the isolation regions in the first select region; and
   forming a first gate dielectric on the select region, wherein top substrate active area and isolation regions of the first non-select regions are not exposed during processing of the first select region and forming the first gate dielectric.

7. The method of claim 6 wherein the removal process comprises wet etch and wet clean process.

8. The method of claim 4 wherein selectively processing the first select region further comprises a pre-clean process.

9. The method of claim 3 comprising selectively processing a second select region while protecting second non-select regions after forming the first gate dielectric, wherein the second select region is one of the first, second and third regions different than the first select region.

10. The method of claim 9 wherein the second select region is the memory region.

11. The method of claim 10 comprising forming a second gate dielectric on the second select region, wherein top substrate active area and isolation regions of the second non-select regions are not exposed during processing of the second select region and forming the second gate dielectric.

12. The method of claim 11 wherein the second non-select regions are the HV and logic regions and the second non-select regions are protected by a mask layer.

13. The method of claim 11 wherein selectively processing the second select region comprises performing a removal process to remove the additional dielectric layer over the second select region and to reduce a height of the isolation regions in the second select region.

14. The method of claim 13 wherein selectively processing the second select region further comprises a pre-clean process.

15. The method of claim 13 wherein the isolation regions in the second select region comprises a top surface above a top surface of the second gate dielectric which forms a positive step height.

16. The method of claim 15 wherein the step height comprises a tunable and controllable step height.

17. The method of claim 9 comprising selectively processing a third select region while protecting third non-select regions after forming the second gate dielectric, wherein the third select region is one of the first, second and third regions different than the first and second select regions.

18. The method of claim 17 wherein the third select region is the logic region.

19. A device comprising:
   a substrate prepared with isolation regions, wherein the substrate comprises first, second and third regions, the first region comprises a memory region, the second region comprises a high voltage (HV) region and the third region comprises a logic region;
   additional dielectric layer disposed over and in direct contact with the isolation regions of at least one selected regions, wherein the at least one of the selected regions is one of the first, second and third regions and wherein the additional dielectric layer elevates height of the isolation regions of the selected region; and
   first gate dielectric disposed on the selected region, wherein the additional dielectric layer and the first gate dielectric disposed on the selected region are separate dielectric layers, and the isolation regions of the selected region comprise a top surface which is above a top surface of the first gate dielectric which forms a tunable step height.

20. The device of claim 19 wherein a width of a top active substrate area and a width of a lower active substrate area of the selected region is about the same.

21. A device comprising:
- a substrate prepared with isolation regions, wherein the substrate comprises first, second and third regions, the first region comprises a memory region, the second region comprises a high voltage (HV) region and the third region comprises a logic region; and
- first gate dielectric disposed on the memory region, second gate dielectric disposed on the HV region and third gate dielectric disposed on the logic region, wherein the isolation regions in the memory and logic regions comprise a top surface which is above a top surface of the first and third gate dielectrics which forms a positive step height.

* * * * *